US010692855B2

(12) United States Patent
Lin et al.

(10) Patent No.: US 10,692,855 B2
(45) Date of Patent: Jun. 23, 2020

(54) ESD PROTECTION DEVICE STRUCTURE COMPATIBLE WITH CMOS PROCESS

(71) Applicant: eGalax_eMPIA Technology Inc., Taipei (TW)

(72) Inventors: Po-Chuan Lin, Taipei (TW); Shr-Hau Shiue, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 179 days.

(21) Appl. No.: 15/986,245

(22) Filed: May 22, 2018

(65) Prior Publication Data

US 2019/0206857 A1 Jul. 4, 2019

(30) Foreign Application Priority Data

Dec. 28, 2017 (TW) .............................. 106146288 A

(51) Int. Cl.
| | | |
|---|---|---|
| H01L 27/02 | (2006.01) | |
| H01L 29/78 | (2006.01) | |
| H01L 29/10 | (2006.01) | |
| H01L 23/528 | (2006.01) | |
| H01L 27/088 | (2006.01) | |
| H01L 23/58 | (2006.01) | |
| H01L 27/092 | (2006.01) | |
| H02H 9/04 | (2006.01) | |

(52) U.S. Cl.
CPC ........ H01L 27/0266 (2013.01); H01L 23/528 (2013.01); H01L 23/585 (2013.01); H01L 27/088 (2013.01); H01L 29/1079 (2013.01); H01L 29/1095 (2013.01); H01L 29/78 (2013.01); H02H 9/046 (2013.01)

(58) Field of Classification Search
CPC ............. H01L 27/0266; H01L 29/1079; H01L 29/1095; H01L 29/78; H01L 23/528; H02H 9/046
See application file for complete search history.

(56) References Cited

U.S. PATENT DOCUMENTS

2006/0033163 A1* 2/2006 Chen ................... H01L 29/0649
257/355
2018/0301445 A1* 10/2018 Yam .................... H01L 27/0262

* cited by examiner

*Primary Examiner* — Marcos D. Pizarro
*Assistant Examiner* — Antonio B Crite
(74) *Attorney, Agent, or Firm* — Muncy, Geissler, Olds & Lowe, PC

(57) ABSTRACT

An ESD protection device structure compatible with CMOS process is disclosed. In the ESD protection device structure, a power source I/O unit or a signal I/O unit of an I/O circuit is electrically connected to an electrostatic discharge clamp circuit including multiple low-voltage PMOS structure are formed in the P-type substrate and connected in series. Source and gate on low voltage N-type well of first low-voltage PMOS structure are electrically connected to a high-voltage power terminal pad through a first power line, or electrically connected to a signal transmission terminal pad through a signal transmission line, and drain of final low-voltage PMOS structure is electrically connected to a high voltage ground terminal pad through second power line. The ESD protection device structure using the serially-connected low-voltage PMOS structures only, can use the circuit layout area more efficiently and provide high ESD tolerance.

14 Claims, 10 Drawing Sheets

ESD PROTECTION DEVICE STRUCTURE COMPATIBLE WITH CMOS PROCESS

This application claims the priority benefit of Taiwan patent application number 106146288, filed on Dec. 28, 2017.

BACKGROUND OF THE INVENTION

1. Field of the Invention

The present invention relates to an ESD protection device structure compatible with CMOS process. More particularly, in an ESD protection device structure, an I/O circuit is electrically connected to an electrostatic discharge clamp circuit which uses serially-connected low-voltage PMOS structures only, so as to more efficiently use the circuit layout area and provide high ESD tolerance.

2. Description of the Related Art

In recent years, semiconductor process technology has been continuously developed and advanced, integrated circuits are manufactured by using CMOS process technology to meet the demands for miniaturization, high density, and higher functionality. In order to manufacture the components with smaller sizes, the CMOS process has also entered the era of deep sub-micron from the sub-micron. Most of the integrated circuits include metal oxide semiconductor transistor devices such as MOSFETs, and have various requirements in structure and process, such as thinner gate oxide layer, shorter channel length, shallower source-drain junction, and structure with lower doping concentration, so the integrated circuits have greatly reduced ESD tolerances and are more vulnerable by electrostatic discharge (ESD). Therefore, an effective ESD protection design has become an important and indispensable part for semiconductor component.

The integrated circuit using the CMOS process may include high-voltage components and low-voltage components, and a high-voltage input/output contact (I/O Pin) must be designed with an ESD protection circuit which is able to withstand high voltage, so as to increase the ESD tolerance of the integrated circuit. For an analog I/O, the electrostatic discharge protection circuit provides two effects, the first one is to provide an ESD discharge path from HVDD to HVSS, and the other is to provide an ESD discharge path from the analog I/O to HVSS. Please refer to FIGS. 5 and 6, which show a design structure of a conventional ESD protection circuit. In the conventional ESD protection circuit, high voltage PMOS and NMOS are connected to form large-sized gate-grounded NMOS (GGNMOS) and gate-VDD PMOS (GDPMOS), and the spacing defined in the MOS process layout rule must be increased to design the conventional ESD protection circuit. The electrostatic discharge protection devices are tested by transmission line pulse (TLP) system, to simulate occurrence of electrostatic discharge.

As shown in FIG. 8, a characteristic curve of the general ESD protection device measured by using the TLP system has a trigger voltage critical point at A (Vt1, It1). When high-energy current pulse of ESD is inputted into the ESD protection device, the voltage rises (such as from 0 to A point), and once the voltage exceeds the critical value of Vt1, the ESD protection device forms a low-impedance path to discharge the transient energy of ESD, so that the protection device enters the snapback status (region) which is from A point to B point of the characteristic curve of, and there is a holding voltage Vh at the point B (Vh, Ih). When transient energy of the ESD is continuously inputted into the protection device, the protection device also forms the low-impedance discharge path to discharge the transient energy of the ESD, for example, in the region from B point to C point of the characteristic curve. When the ESD voltage continuously rises and the ESD discharge current is higher than the failure current (It2), the protection device is unable to load and enters the second breakdown status (region), that is, the region above the C point of the characteristic curve, and the protection device may be burnt.

Furthermore, the trigger voltage is the voltage on the trigger point at which the protection device instantaneously enters the snapback breakdown status (region). The trigger voltage of the ESD protection device must be lower than the breakdown voltage (BV) of core components, so that the ESD protection device can be enabled before the core is damaged by electrostatic zapping. The holding voltage is the lowest voltage in the snapback breakdown region and must be higher than the operation voltage (VDD) of the circuit, so as to prevent occurrence of latch-up effect. The characteristic curve obtained from the TLP measurement can help to design an ESD protection device with high ESD protection capability.

In practical applications, the low-voltage PMOS and NMOS components are electrically connected to form GDPMOS and GGNMOS structures as the ESD protection device used in low-voltage environment, and the high-voltage PMOS and NMOS components are electrically connected to for GDPMOS and GGNMOS structures as the ESD protection device used in high-voltage environment. In a condition that the low-voltage components are used in the low-voltage environment, the breakdown voltage of the low-voltage component is mostly about twice the operation voltage, for example, the breakdown voltage of a 3.3V component is 6.2V, so the ESD design window is relatively wider and the ESD protection is safer; however, in a condition that the high-voltage components are used in the high-voltage environment, because of process limitations, the breakdown voltage of high-voltage component is mostly only 1.1 to 1.5 times of the operation voltage, for example, the breakdown voltage of a 32V component is 45V, so the ESD design window becomes relatively narrower. In order prevent the core from operating in the breakdown voltage region, the ESD protection device may enter the snapback breakdown region (status) and transiently exceed the snapback breakdown region to enter the latch-up region, and it causes the ESD component to be destroyed or burned, and vice versa.

Table 1 shows that the industrial test for ESD classifies the sensitivity of ESD event occurrence simulated in human-body model (HBM) and machine model (MM), and the sensitivity is usually classified by withstand voltage. In the component-level industrial test standard, such as MIL-STD-883 standard specification, the IC component is electrostatically charged by the electrostatic spray gun directly, and a simulation circuit (as shown in FIG. 9) for human discharge model is defined with a charge current limiting resistor (R1), which is connected in series with the high voltage source and in a range of 1MΩ to 10 MΩ, and defined with a 1500Ω of discharge resistance (R2) connected in series with the component under test, and defined with an energy storage capacitor (C) of 100 pF. In the system-level industrial test standard, such as the IEC 61000-4-2 standard specification, the system product constituted by the IC components is electrostatically charged by the electrostatic spray gun, and the simulation circuit for human-body model is similar to the MIL-STD-883 standard specification. The main difference between the two standard specifications is the storage capacitor values and discharge resistance values. For example, the discharge resistance defined in the IEC 61000-4-2 standard specification is in a range of 50MΩ to 100MΩ, and the storage capacitor defined in the IEC 61000-4-2 standard specification is 150 pF, and the discharge energy and electrostatic peak current defined in the IEC 61000-4-2 standard specification are also different from that defined in MIL-STD-883 standard specification. In the non-standard test, which replicates the actual burn-out experiment, the system product constituted by IC components is powered on, and then directly use the system-level electrostatic spray gun, which is defined in the IEC 61000-4-2 standard specification and has much higher energy than the component-level electrostatic spray gun, to apply the static electricity to IC components in the system product.

TABLE 1

Industrial standard test sensitivity classification for human body model

| Classification | Sensitivity |
| --- | --- |
| Class 1 | 0 to 1,999 Volts |
| Class 2 | 2,000 to 3,999 Volts |
| Class 3 | 4,000 to 15,999 Volts |

Test Standard Specification: MIL-STD-883

Furthermore, the high pressure environment is very complex, so the conventional ESD protection component, which has passed component-level standard test of the ESD industrial test, may possibly be seriously affected by electrostatic in actual environment (this burn-out experiment can be reproduced by the system-level industry standard test), and it may cause the convention ESD protection device to suddenly enter and exceed the snapback breakdown region and the convention ESD protection device then enters into the latch-up region to be burn. According to the characteristic curve (shown in the FIG. 10) obtained by the TLP measurement performed on the ESD protection device which is formed by the high voltage PMOS and NMOS components (shown in FIGS. 5 and 6), the critical point Vt1 is very close to the breakdown voltage of 43V, and the holding voltage Vh is much lower than the operating voltage of 32V. FIG. 10 shows the physical characteristics of the high-voltage components. Such ESD protection device can pass ESD industrial testing standards, but the ESD protection device may occasionally enter and exceed the snapback breakdown region, to enter into the latch-up area and be burned in the actual environment. Therefore, what is needed is to design an ESD protection device having small size and high ESD tolerance, to solve the above-mentioned problems.

SUMMARY OF THE INVENTION

In order to solve aforementioned conventional problems and drawbacks, the inventor collects related data and performs multiple tests and modifications, to develop the ESD protection device structure compatible with CMOS process.

An objective of the present invention is that an electrostatic discharge (ESD) clamp circuit is electrically connected to a power source I/O unit of the I/O circuit or between the power source I/O unit and a signal I/O unit of the I/O circuit, and at least three low-voltage PMOS structures are formed on a P-type substrate of the ESD clamp circuit and electrically connected in series, and each low-voltage PMOS structure includes gate, source and drain formed in a low-voltage N-type well, and among the low-voltage PMOS structures, source and gate of a first low-voltage PMOS structure are electrically connected to a high-voltage power terminal pad through a first power line, or electrically connected to a signal transmission terminal pad through a signal transmission line, and drain of a final low-voltage PMOS structure is electrically connected to a high voltage ground terminal pad through a second power line, so as to form an ESD current discharge path. The ESD protection device of the present invention using serially-connected low-voltage PMOS structures only, can have a double withstanding voltage and reduce the spacing compatible with the layout design rule, so as to have excellent area efficiency and provide high ESD tolerance, thereby preventing the component from being broken by electrical latch-up effect; furthermore, the ESD current can be discharged to ground quickly, so as to efficiently protect the core from being damaged.

Another objective of the present invention is that the amount of the serially-connected low-voltage PMOS structures is determined by dividing a predetermined high withstanding voltage of the ESD clamp circuit by n times of the turn-on voltage of single low-voltage PMOS structure and rounding down the divide result to an integer, wherein n is an integer not higher than 3. Therefore, during ESD, a transient reverse pulse voltage is applied to the high-voltage power terminal pad of the power source I/O unit or the signal transmission terminal pad of the signal I/O unit and triggers the gates of the serially-connected low-voltage PMOS structures to turn on, so as to provide the ESD current discharge path to quickly discharge the ESD current to the ground through the four serially-connected low-voltage PMOS structures and high-voltage power terminal pad or signal transmission terminal pad, so that the ESD current can be discharged to ground promptly and stopped from flowing into the core, thereby implementing the ESD protection effect.

Another objective of the present invention is that the ESD clamp circuit includes low-voltage protection seal rings and a high-voltage protection seal ring, and the low-voltage protection seal ring is formed in a N-type heavily-doped region of a low-voltage N-type well and surrounds a first P-type heavily-doped region of the source of each low-voltage PMOS structure and a second P-type heavily-doped region of the drain of each low-voltage PMOS structure. The low-voltage protection seal rings are configured to block signals generated by adjacent low-voltage PMOS structures from interfering with each other, and reduce effect of noise from external components. The high-voltage protection seal ring includes a high-voltage P-doped region formed on the P-type substrate and a third P-type heavily-doped region formed on the high-voltage P-doped region. The high-voltage protection seal ring surrounds an outermost peripheral of the low-voltage PMOS structures, so as to more effectively block the noise from external components.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
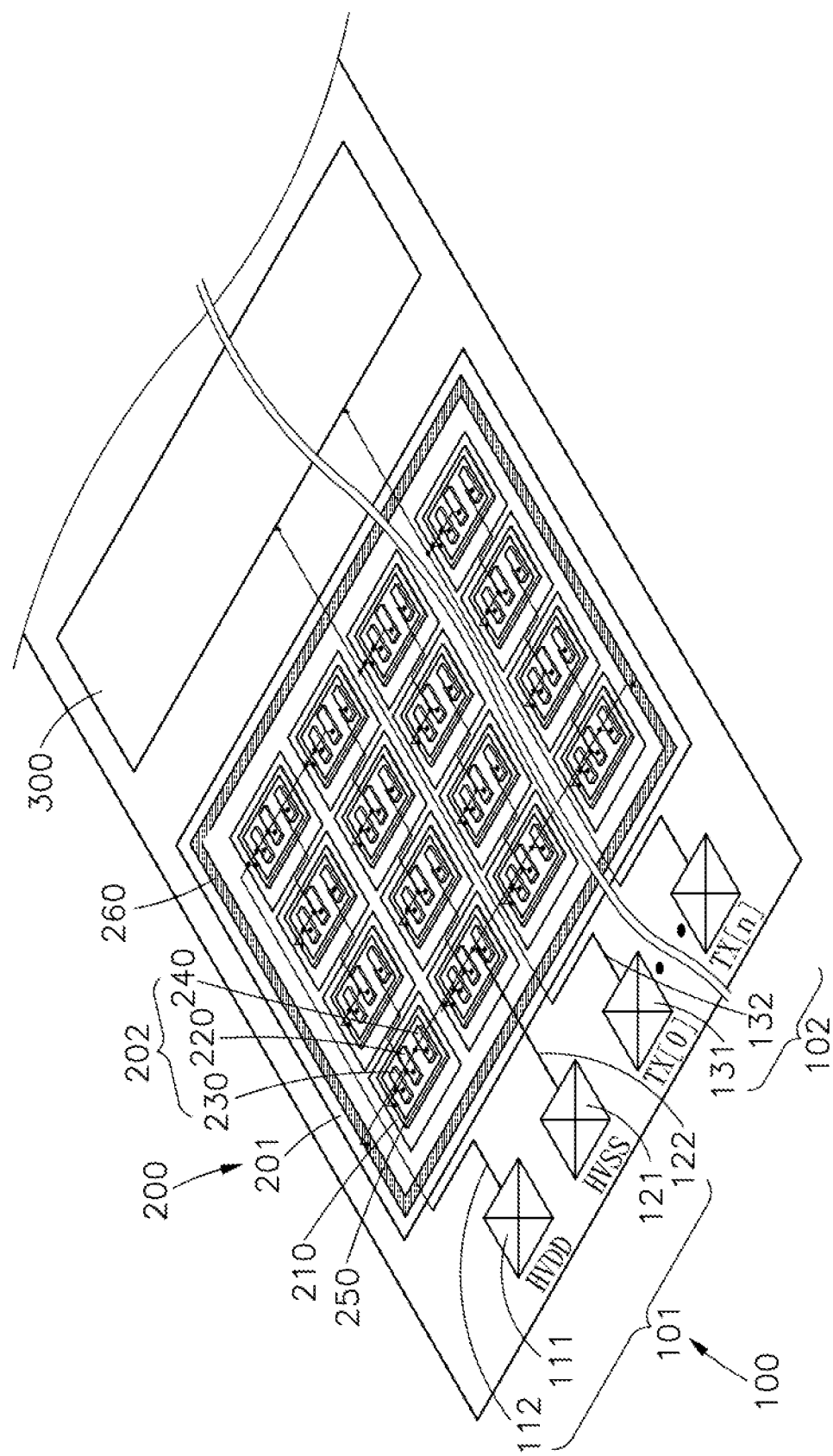
FIG. 1 is an elevational view of an ESD protection device circuit layout of the present invention.
Figure 2:
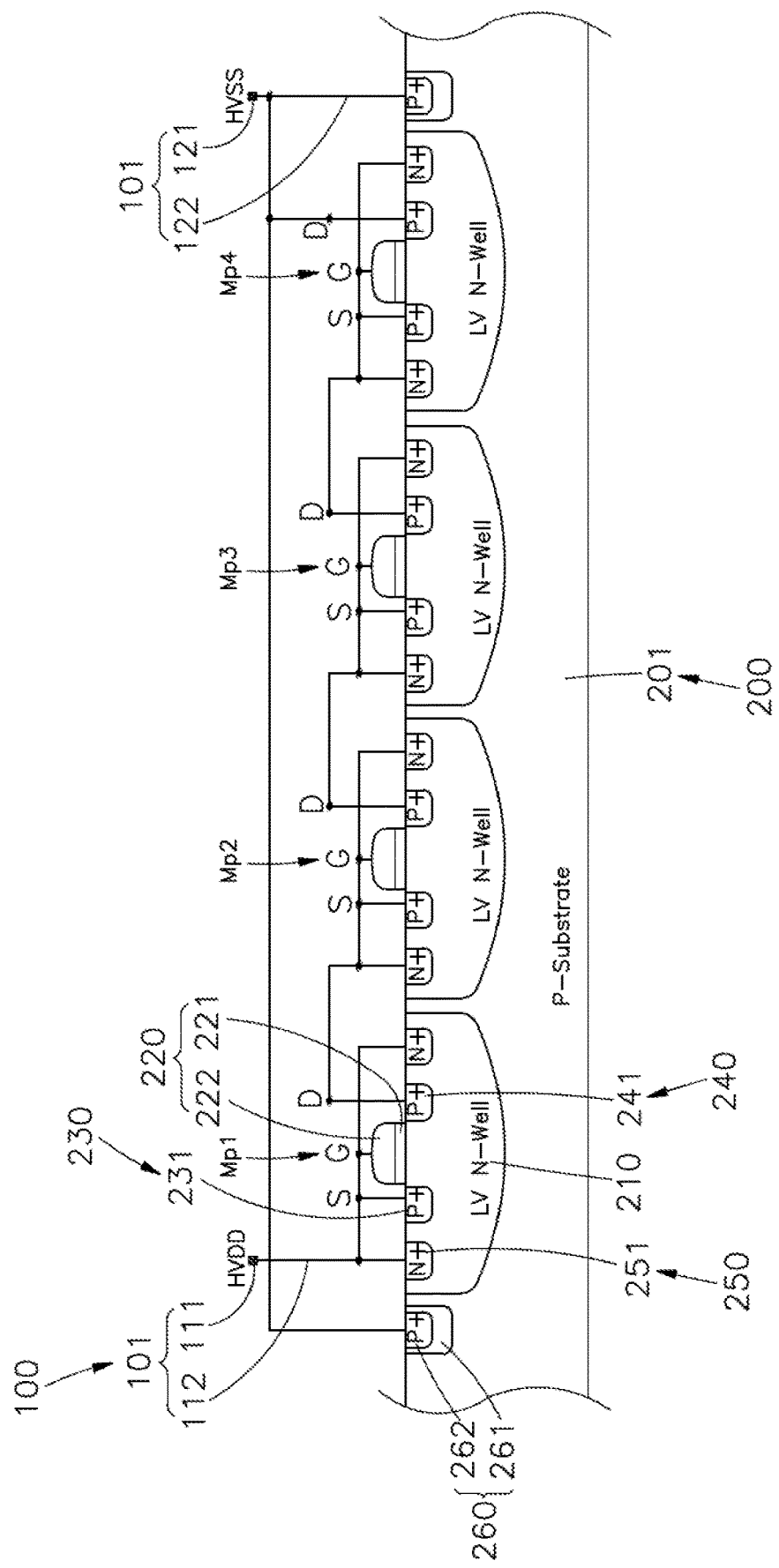
FIG. 2 is a schematic cross-sectional of a part of the electrostatic discharge clamp circuit electrically connected between HVDD and HVSS of the I/O clamp circuit, in accordance with an embodiment of the present invention.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

Please refer to FIGS. 1 to 4, which show elevational view of ESD protection device circuit layout of the present invention, schematic cross-sectional view of a part of the electrostatic discharge clamp circuit electrically connected to HVDD and HVSS of the I/O circuit, a schematic cross-sectional view showing a part of the electrostatic discharge clamp circuit electrically connected to TX and HVSS of the I/O circuit, and a voltage-versus-current diagram of a test result of the ESD protection device of an embodiment of the present invention. As shown in FIG. 1, the ESD protection device structure can be compatible with CMOS process and includes an I/O circuit 100, an electrostatic discharge clamp circuit 200 and a core 300.

The I/O circuit 100 includes a power source I/O unit 101 and a signal I/O unit 102. The power source I/O unit 101 comprises a high-voltage power terminal pad 111, a first power line 112 electrically connected to the high-voltage power terminal pad 111, a high voltage ground terminal pad 121, and a second power line 122 electrically connected to the high voltage ground terminal pad 121. A signal I/O unit 102 is an analog I/O including a plurality of signal transmission terminal pads (TX[0]~TX[n]) 131, and a plurality of signal transmission lines 132 electrically connected to the plurality of signal transmission terminal pads (TX[0]~TX[n]) 131, respectively.

The electrostatic discharge clamp circuit 200 includes a P-type substrate 201, and at least three low-voltage PMOS structures 202 formed on the P-type substrate 201 and connected in series, and a plurality of low-voltage N-type wells (LV N-Well) 210 formed on the P-type substrate 201 correspondingly in position to the low-voltage PMOS structures 202, respectively. Each low-voltage PMOS structure 202 includes gate 220, source 230 and drain 240 formed in the low-voltage N-type well 210 corresponding thereto. The gate 220 is disposed on the low-voltage N-type well 210 between the source 230 and the drain 240, and includes a dielectric layer 221 and a gate electrode 222 disposed on the dielectric layer 221. The source 230 and the drain 240 of each low-voltage PMOS structure 202 are disposed on a first P-type heavily-doped region (P+) 231 and a second P-type heavily-doped region (P+) 241 in the low-voltage N-type well 210, respectively. The dopant concentrations of the first P-type heavily-doped region 231 and the second P-type heavily-doped region 241 is higher than that of the low-voltage N-type well 210, so as to form a PMOS transistor.

In an embodiment, the ESD clamp circuit 200 includes low-voltage protection seal rings 250 and a high-voltage protection seal ring 260. Each low-voltage protection seal ring 250 is formed in a N-type heavily-doped region (N+) 251 of the low-voltage N-type well 210 corresponding thereto, and surrounds the first P-type heavily-doped region 231 and the second P-type heavily-doped region 241 of the low-voltage N-type well 210 corresponding thereto, so that the low-voltage protection seal ring 250 can block signals generated by adjacent PMOS transistor from interfering with each other, and reduce noise from external component. The high-voltage protection seal ring 260 includes a high-voltage P-doped region 261 formed on the P-type substrate 201, and a third P-type heavily-doped region 262 formed in the high-voltage P-doped region 261. The high-voltage protection seal ring 260 surrounds an outermost peripheral of the low-voltage PMOS structures 202, thereby more effectively block noise from external components.

The core 300 is a circuit inside an integrated circuit, such as a microcontroller or a system-on-chip.

In this embodiment, the electrostatic discharge clamp circuit 200 includes at least three low-voltage PMOS structures 202, and the at least three low-voltage PMOS structures 202 are electrically connected between HVDD and HVSS of the I/O circuit 100 or between TX and HVSS of the I/O circuit 100, so as to form an array arrangement. Each low-voltage PMOS structure 202 forms a PMOS transistor. In following content, four PMOS transistors Mp1 to Mp4 electrically connected in series between HVDD and HVSS and between TX and HVSS are taken as an example for illustration, however, the present invention is not limited to this example. The source 230 and the gate 220 of each of the PMOS transistors are electrically connected to each other. Among the four PMOS transistors, the source 230 and the gate 220 of the first PMOS transistor Mp1, and the low-voltage protection seal ring 250 are electrically connected to the high-voltage power terminal pad 111 through the first power line 112; the drain 240 of the first PMOS transistor Mp1 is electrically connected to the source 230 and the gate 220 of the second PMOS transistor Mp2 and the low-voltage protection seal ring 250, and so forth. In other words, the drain 240 of previous PMOS transistor Mp3 is electrically connected to the source 230, gate 220 of the next PMOS transistor Mp4 and the low-voltage protection seal ring 250 to form serial connection; the drain 240 of the last PMOS transistor Mp4, the high-voltage protection seal ring 260 are electrically connected to the high voltage ground terminal pad 121 through the second power line 122, and the source 230 and the gate 220 of the first PMOS transistor Mp1, and the low-voltage protection seal ring 250 corresponding thereto are electrically connected to the signal transmission terminal pad (TX) 131 through the signal transmission line 132.

Furthermore, in the I/O circuit 100, the signal transmission lines 132 of the signal I/O unit 102 are disposed between the first power line 112 and the second power line 122 of the power source I/O unit 101, and the node electrically connected to the source 230 and the gate 220 of the first low-voltage PMOS structure 202 and the low-voltage protection seal ring 250 is electrically connected to the core 300. Depended on the design of the core 300, the signal I/O unit 102 can have different function, for example, the signal I/O unit 102 can be electrically connect to an external circuit for outputting driving current or receiving input signal. When ESD voltage is applied to the power source I/O unit 101 and the signal I/O unit 102, the electrostatic discharge clamp circuit 200 can provide the low-impedance ESD current discharge path to prevent the ESD current from flowing into and damaging the core 300.

In this embodiment, in order to determine a number of the serially-connected low-voltage PMOS structures 202 of the electrostatic discharge clamp circuit 200, a predetermined withstanding voltage of the electrostatic discharge clamp circuit 200 is divided by n times of the turn-on voltage of single low-voltage PMOS structure 202 and the divide result is rounded down to an integer, wherein n is an integer not higher than 3, that is, n is lower than or equal to 3. For example, in a condition of using the low-voltage PMOS structure 202 having 3.3V turn-on voltage to protect a high-voltage device operated under 32V, according to the above-mentioned calculation function, the predetermined withstanding voltage (32V) divided by three times of the turn-on voltage (3.3V) makes 3.23 . . . , and the divide result is rounded down to 4; for this reason, four serially-connected low-voltage PMOS structures 202 are used to form the electrostatic discharge clamp circuit 200.

In normal operation mode (that is, no occurrence of electrostatic discharge), the gates 220 of the serially-connected low-voltage PMOS structures 202 of the electrostatic discharge clamp circuit 200 are biased to a high voltage level equal to HVDD, and the low-voltage PMOS structures 202 are turned off and not triggered, so that the I/O circuit 100 is in an open-circuit status between HVDD and HVSS or between TX and HVSS, and the electrostatic discharge clamp circuit 200 does not affect normal operation of the core 300. When the ESD occurs, a transient reverse pulse voltage applied to the high-voltage power terminal pad 111 of the power source I/O unit 101 or the signal transmission terminal pad 131 of the signal I/O unit 102, may trigger the gates 220 of the serially-connected low-voltage PMOS structures 202 to turn on; in this case, the serially-connected PMOS transistors Mp1 to Mp4 are triggered to turn on, to provide the ESD current discharge path to quickly discharge the ESD current to the ground through the four serially-connected low-voltage PMOS structures 202, and the high-voltage power terminal pad 111 or signal transmission terminal pad 131, so that the ESD current can be discharged promptly and prevented from flowing into the core 300, thereby implementing the effect of ESD protection.

Figure 3:
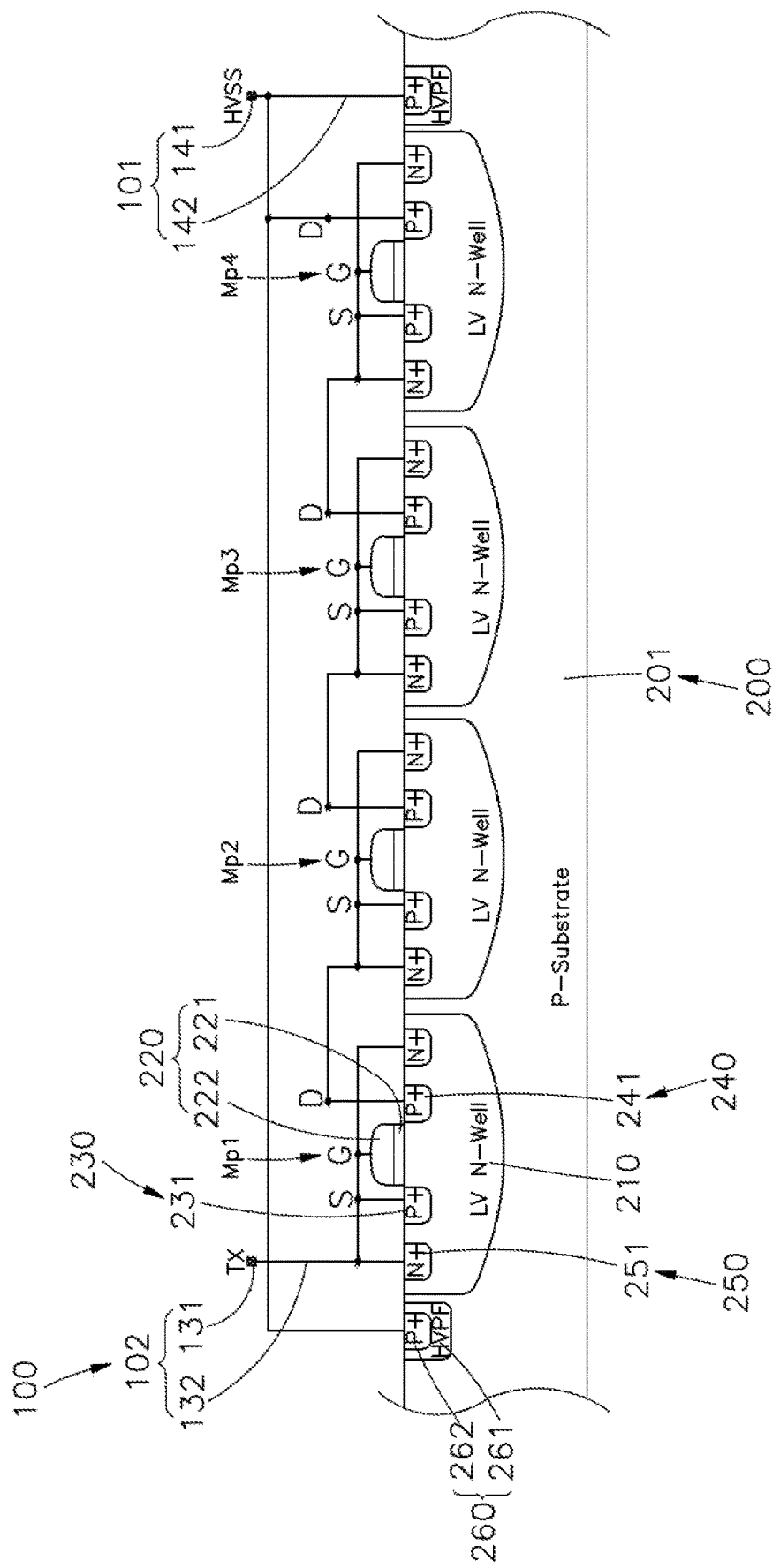
FIG. 3 is a schematic cross-sectional view showing a part of the electrostatic discharge clamp circuit electrically connected between TX and HVSS of the I/O circuit, in accordance with an embodiment of the present invention.
Figure 6:
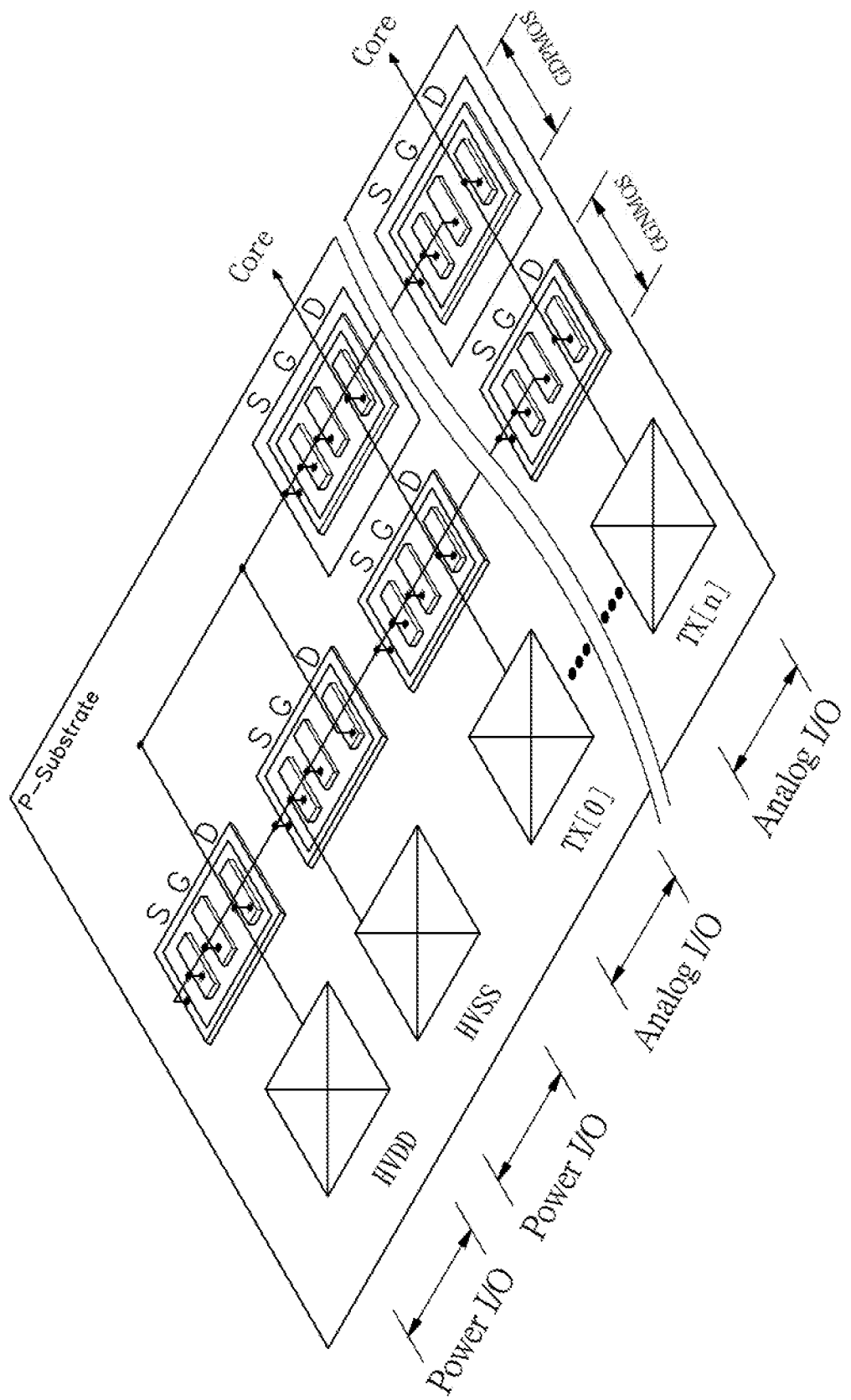
FIG. 6 is an elevational view of a conventional ESD protection circuit layout.
Figure 7:
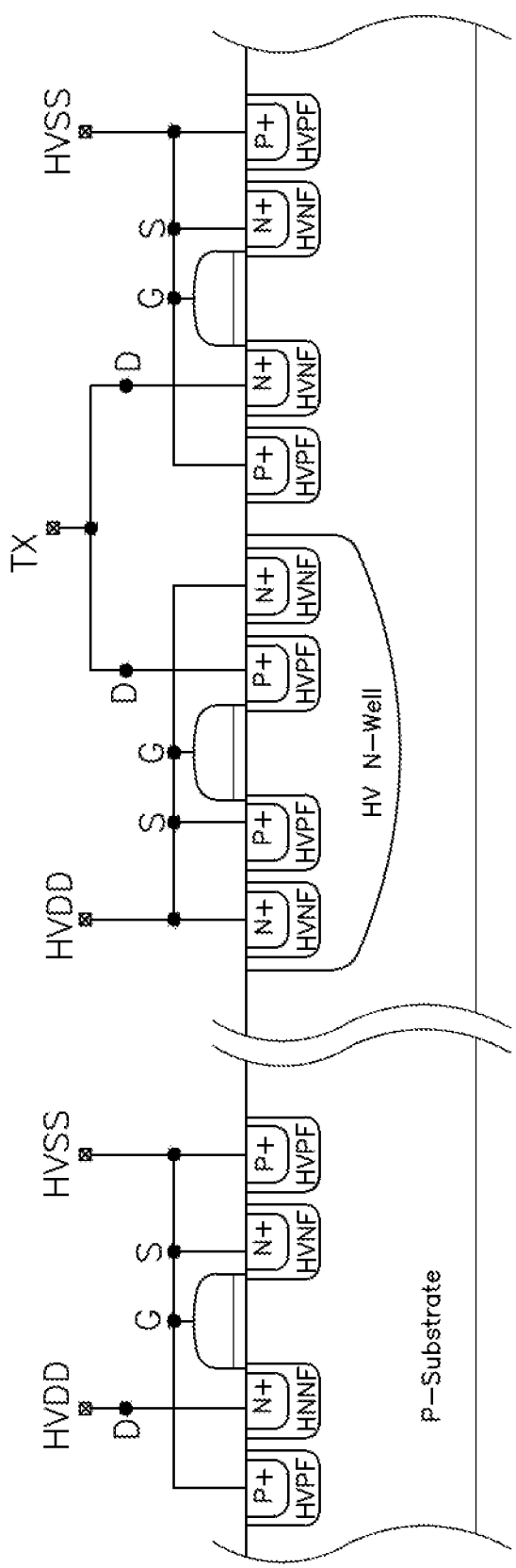
FIG. 7 is a schematic cross-sectional view of a conventional ESD protection circuit.
Figure 8:
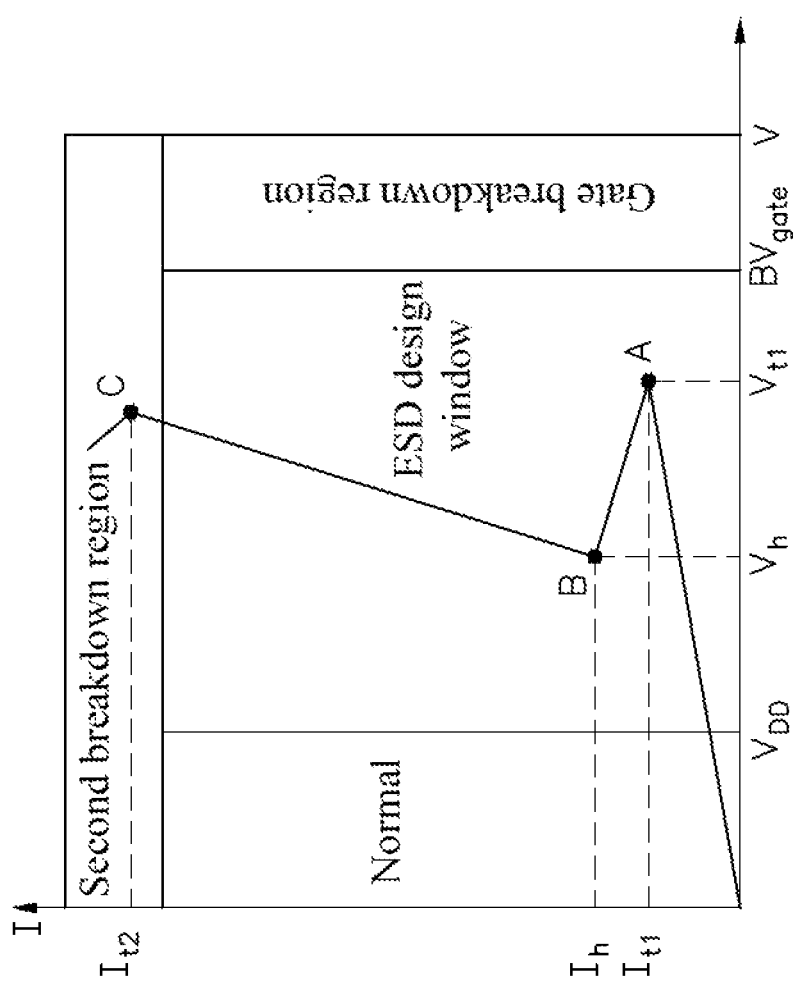
FIG. 8 is a diagram showing a characteristic curve of a conventional ESD design window.

As shown in FIG. 3, compared to layout of the conventional ESD protection circuit shown in FIG. 6, the electrostatic discharge clamp circuit 200 of the present invention uses the serially-connected low-voltage PMOS structures 202 only, so that the electrostatic discharge clamp circuit 200 of the present invention can be more proper for entire layout arrangement in a limited area, and have higher area use efficiency. In the other hand, as shown in FIG. 6, the conventional ESD protection circuit uses both of GDPMOS and GGNMOS implemented based on large-sized PMOS structure and NMOS structure, and the PMOS and NMOS must be spaced by a sufficient distance according to manufacturing layout design rule, otherwise the latch-up effect may be occurred more easily. Furthermore, the power I/O uses the GGNMOS only, so it unable to use the empty area above the GGNMOS and available for GDPMOS layout. In this embodiment, the serially-connected low-voltage PMOS structures 202 not only can be used to double the withstanding voltage, but also can provide a high ESD tolerance in a smaller circuit layout area, to prevent the ESD protection device from being broken by electrical latch-up effect; furthermore, the ESD protection device of this embodiment can quickly discharge the ESD current to ground through HVSS, to effectively protect the core 300 from being damaged, and reduce spacing compliant with the layout design rule and have excellent area efficiency, thereby achieving the effect of reducing entire circuit layout area and cost.

Figure 4:
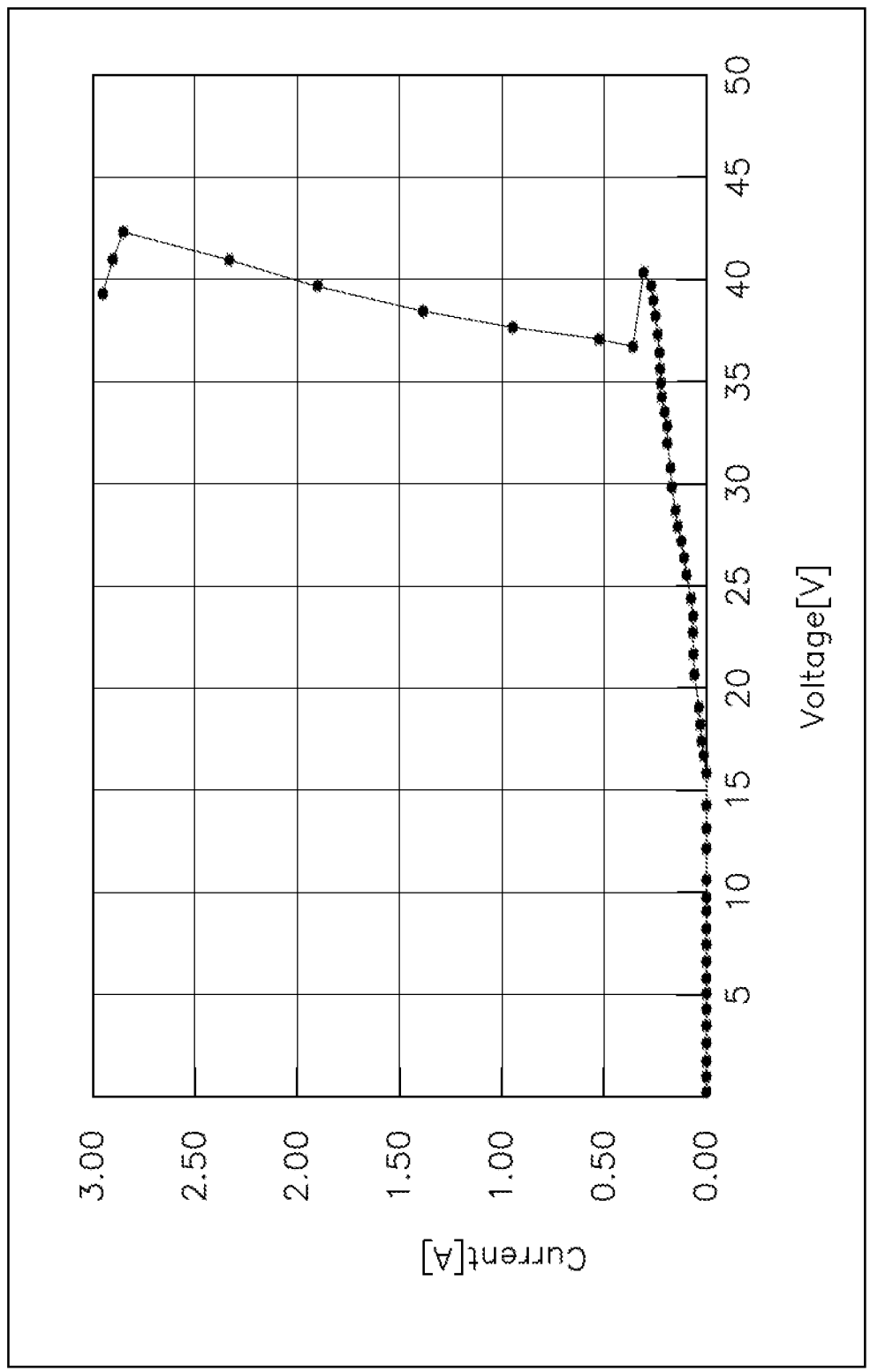
FIG. 4 is a voltage-versus-current diagram of a test result of an ESD protection device of an embodiment of the present invention.
Figure 5:
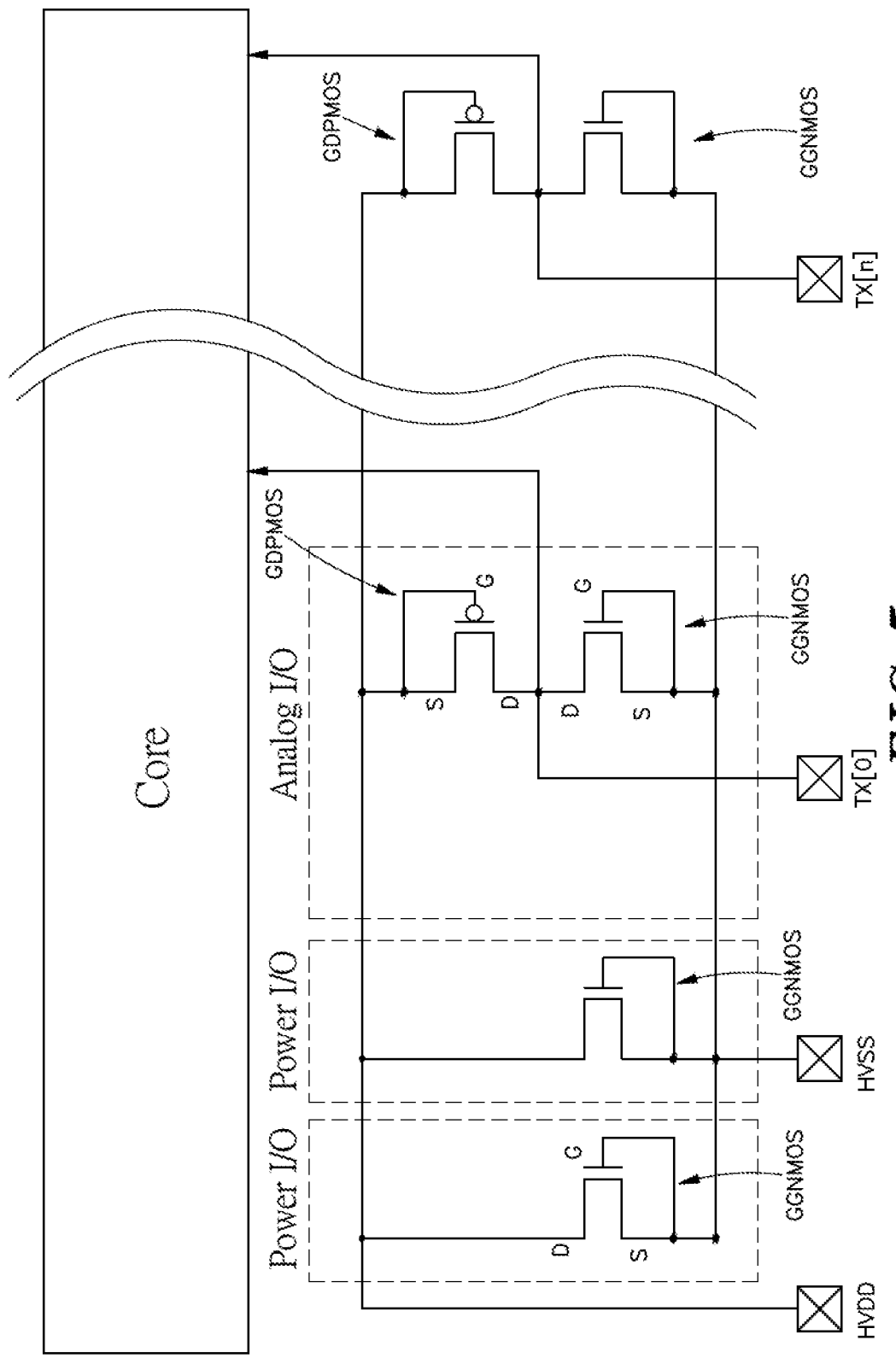
FIG. 5 is an equivalent circuit diagram of a conventional ESD protection circuit.
Figure 9:
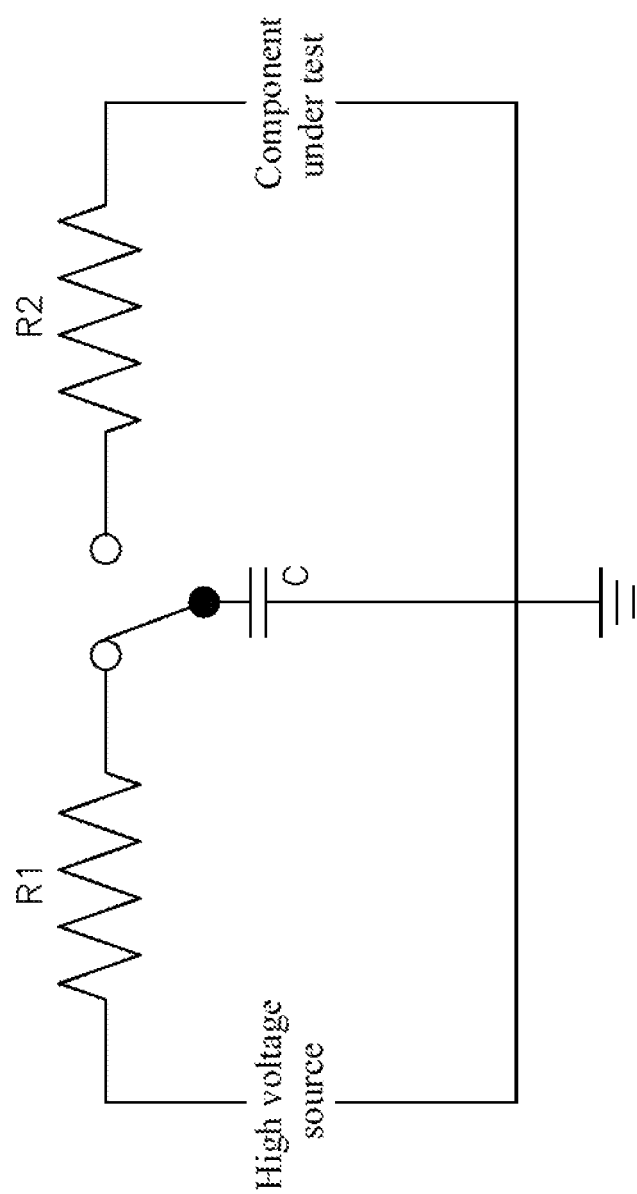
FIG. 9 is a simple equivalent circuit diagram of a conventional human-body model test.
Figure 10:
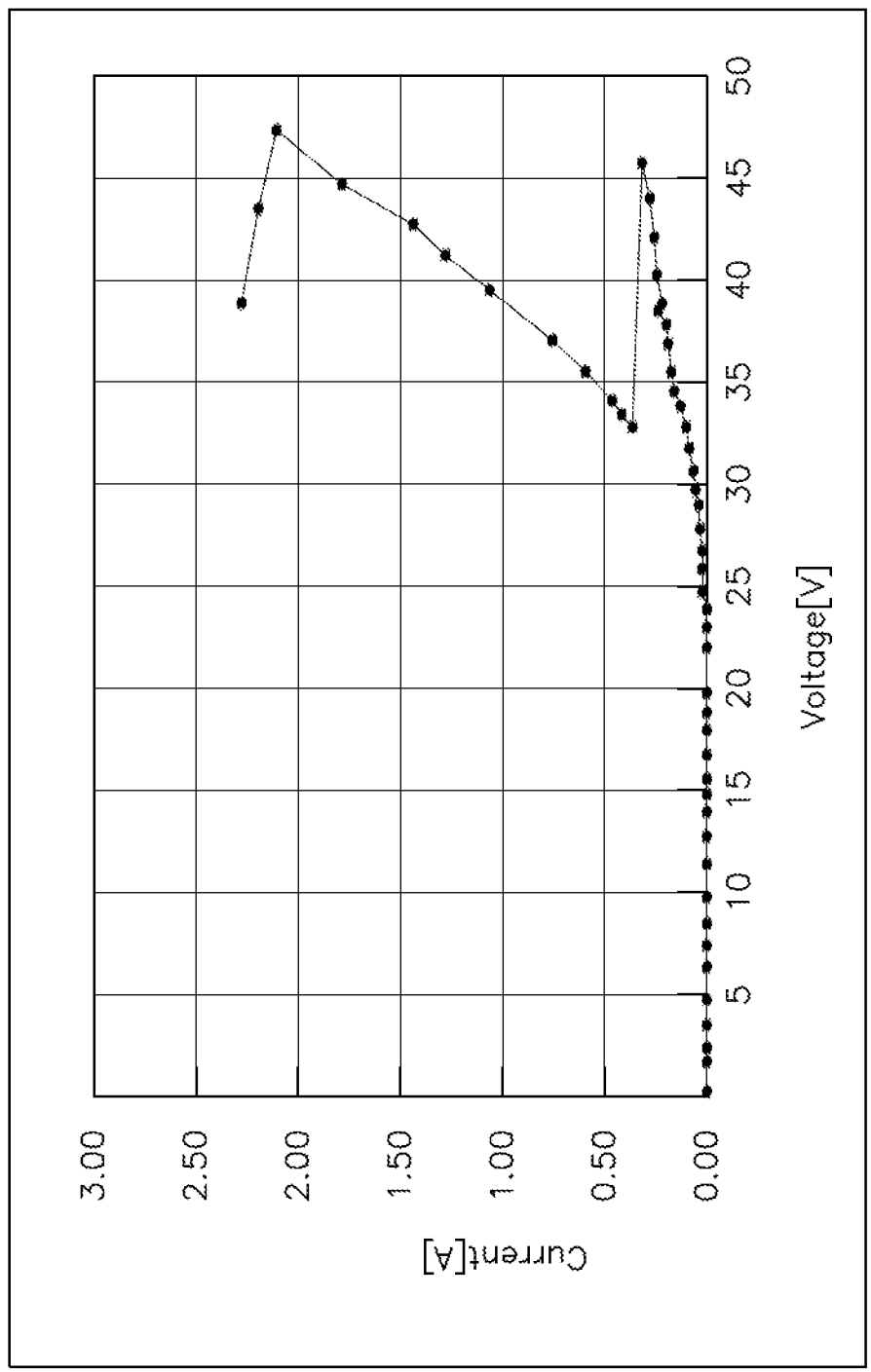
FIG. 10 is a voltage-versus-current diagram of a test result of a conventional ESD protection circuit.

Please refer to FIG. 4, which shows a voltage-versus-current diagram of a test result of an actual measurement in which the TLP system is used to generate pulse voltage zapping to simulate ESD occurred on the structure of this embodiment in layout area the same as the layout area of the conventional ESD protection device. According to the test result, trigger voltage and current of the ESD protection device of the present invention (Vt1, It1)=(40.32, 0.25), and holding voltage (Vh, Ih)=(36.37, 0.35). Compared with the test result of the conventional ESD protection circuit (as shown in FIG. 9) where the trigger voltage and current (Vt1, It1)=(45.66, 0.22) and the holding voltage (Vh, Ih)=(32.26, 0.26), the lower trigger voltage of the ESD protection device of the embodiment of the present invention is lower, so that the electrostatic discharge clamp circuit 200 can be turned on faster before the core 300 is broken by ESD zapping; furthermore, the significantly improved holding voltage of the ESD protection device of the present invention can effectively prevent occurrence of the latch-up effect. As a result, the ESD protection device of the present invention can provide excellent ESD protection effect indeed.

The table 2 below shows a result of comparison between HBM ESD tests of the ESD protection device structure of the present invention and the conventional ESD protection device structure, and an actual measurement result of the TLP system.

TABLE 2

A result of comparison between ESD tests of structure of the present invention and the conventional structure

| | | | Conventional ESD protection device structure | ESD protection device structure of the present invention |
|---|---|---|---|---|
| Component level Standard test Non-standard test | MIL-STD-883 | Analog I/O | ±3500 v Pass | ±4000 v Pass |
| | | Power I/O | ±5500 v Pass | ±6000 v Pass |
| | IEC 61000-4-2 | Analog I/O | ±1000 v Pass | ±4500 v Pass |
| | | Power I/O | ±1500 v Pass | ±8000 v Pass |
| | TLP measure | Vt1 | 45.66 v | 40.32 v |
| | | Vh | 32.26 v | 36.37 v |

According to aforementioned test result, the ESD protection device structure of the present invention has a turn-on voltage Vt1 slightly lower than that of the conventional ESD protection device structure, so that the ESD protection device structure of the present invention can pass the standard class 2 (Class 2 2000V~3999V) in general component-level ESD standard test; in TLP measure, the ESD protection device structure of the present invention has a holding voltage (36.37V) greatly higher than the holding voltage (32.26V) of the conventional ESD protection device structure, so that, in the test experiment of the ESD test system, in which the IC component of the system product is directly charged by electrostatic spray gun to simulate human body contacting the system product and charging, the ESD protection device structure of the present invention can have ESD protection capability greatly better than the conventional ESD protection device structure. As a result, the ESD protection device structure of the embodiment of the present invention can provide the IC component with resistance against the electrostatic discharge and the variation of the power source when the IC component is applied in real environment.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. An electrostatic discharge (ESD) protection device structure compatible with CMOS process, and the ESD protection device structure comprising an I/O circuit and an ESD clamp circuit:

wherein the I/O circuit comprises a power source I/O unit, and the power source I/O unit comprises a high-voltage power terminal pad, a first power line electrically connected to the high-voltage power terminal pad, a high voltage ground terminal pad, and a second power line electrically connected to the high voltage ground terminal pad;

wherein the electrostatic discharge clamp circuit comprises a P-type substrate, and at least three low-voltage PMOS structures formed on the P-type substrate and electrically connected in series, and a plurality of low-voltage N-type wells formed on the P-type substrate correspondingly in position to the low-voltage PMOS structures, respectively, and each of the plurality of low-voltage PMOS structures comprises gate, source and drain formed on one of the plurality of low-voltage N-type wells corresponding thereto, the source and the gate of each of the plurality of low-voltage PMOS structures are electrically connected to each other, wherein among the plurality of low-voltage PMOS structures, source and gate of a first low-voltage PMOS structure are electrically connected to the high-voltage power terminal pad through the first power line, and a drain of a final low-voltage PMOS structure is electrically connected to the high voltage ground terminal pad through the second power line, so as to form an ESD current discharge path.

2. The ESD protection device structure according to claim 1, wherein among the plurality of low-voltage PMOS structure of the electrostatic discharge clamp circuit, drain of a previous low-voltage PMOS structure is electrically connected to source and gate of a next low-voltage PMOS structure in sequential order, so as to form serial connection therebetween.

3. The ESD protection device structure according to claim 1, wherein a number of the plurality of low-voltage PMOS structures of the electrostatic discharge clamp circuit connected in series, is determined by dividing a predetermined high withstanding voltage of the electrostatic discharge clamp circuit by n times of a turn-on voltage of single low-voltage PMOS structure and rounding down a divide result to an integer, wherein n is an integer not higher than 3.

4. The ESD protection device structure according to claim 1, wherein in the electrostatic discharge clamp circuit, each of the plurality of low-voltage PMOS structures comprises the gate disposed on the low-voltage N-type well between the source and the drain thereof, and the gate comprises a dielectric layer and a gate electrode disposed on the dielectric layer, and, the source and drain of each of the low-voltage PMOS structure are disposed on a first P-type heavily-doped region and a second P-type heavily-doped region formed in the low-voltage N-type well, respectively, so as to form a PMOS transistor.

5. The ESD protection device structure according to claim 4, wherein the electrostatic discharge clamp circuit comprises a high-voltage protection seal ring surrounding an outermost peripheral part of the plurality of low-voltage PMOS structures, and the high-voltage protection seal ring comprises a high-voltage P-doped region formed in the P-type substrate, and the drain of a final low-voltage PMOS structure and the high-voltage protection seal ring are electrically connected to the high voltage ground terminal pad through the second power line.

6. The ESD protection device structure according to claim 4, wherein the electrostatic discharge clamp circuit comprises a low-voltage protection seal ring surrounding the first P-type heavily-doped region and the second P-type heavily-doped region, and the low-voltage protection seal ring is formed on a N-type heavily-doped region of the low-voltage N-type well, and the source and the gate of the first low-voltage PMOS structure and the low-voltage protection seal ring are electrically connected to the high-voltage power terminal pad through the first power line.

7. The ESD protection device structure according to claim 6, wherein among the plurality of the low-voltage PMOS structures of the electrostatic discharge clamp circuit, a drain of a previous low-voltage PMOS structure is electrically connected to source and gate of a next low-voltage PMOS structure and the low-voltage protection seal ring in sequential order, so as to form series connection therebetween.

8. An ESD protection device structure compatible with CMOS process, and the ESD protection device structure comprising the I/O circuit and an electrostatic discharge clamp circuit;
wherein the I/O circuit comprises a power source I/O unit and a signal I/O unit, the power source I/O unit comprises the high-voltage power terminal pad, a high voltage ground terminal pad and the second power line electrically connected to a high-voltage power terminal pad and, and the signal I/O unit comprises a plurality of signal transmission lines electrically connected to a plurality of signal transmission terminal pads, respectively;
wherein the electrostatic discharge clamp circuit comprises a P-type substrate, and at least three low-voltage PMOS structures formed on the P-type substrate and electrically connected in series, and a plurality of low-voltage N-type wells formed on the P-type substrate correspondingly in position to the plurality of low-voltage PMOS structures, and each of the plurality of low-voltage PMOS structures comprises gate, source and drain formed on one of the plurality of low-voltage N-type wells corresponding thereto, the source and the gate of each of the plurality of low-voltage PMOS structures are electrically connected to each other, wherein among the plurality of low-voltage PMOS structures, source and gate of a first low-voltage PMOS structure are electrically connected to the signal transmission terminal pad through the signal transmission line, and drain of a final low-voltage PMOS structure is electrically connected to the high voltage ground terminal pad through the second power line, so as to form an ESD current discharge path.

9. The ESD protection device structure according to claim 8, wherein among the plurality of low-voltage PMOS structures of the electrostatic discharge clamp circuit, drain of a previous low-voltage PMOS structure of the electrostatic discharge clamp circuit is electrically connected source and gate of a next low-voltage PMOS structure in sequential order, so as to form serial connection therebetween.

10. The ESD protection device structure according to claim 8, wherein a number of the low-voltage PMOS structure of the electrostatic discharge clamp circuit connected in series, is determined by dividing a predetermined high withstanding voltage of the electrostatic discharge clamp circuit by n times of turn-on voltage of single low-voltage PMOS structure and rounding down the divide result to an integer, wherein n is an integer not higher than 3.

11. The ESD protection device structure according to claim 8, wherein in the electrostatic discharge clamp circuit, each of the plurality of low-voltage PMOS structures comprises the gate disposed on the low-voltage N-type well between the source and the drain thereof, and the gate comprises the dielectric layer and the gate electrode disposed on the dielectric layer, and the source and drain of each of the plurality of low-voltage PMOS structures are disposed on the first P-type heavily-doped region and the second P-type heavily-doped region in the low-voltage N-type well respectively, so as to form a PMOS transistor.

12. The ESD protection device structure according to claim 11, wherein the electrostatic discharge clamp circuit comprises a high-voltage protection seal ring surrounding an outermost peripheral part of the plurality of the low-voltage PMOS structures and comprising the high-voltage P-doped region formed in the P-type substrate, and the drain of the final low-voltage PMOS structure and the high-voltage protection seal ring are electrically connected to the high voltage ground terminal pad through the second power line.

13. The ESD protection device structure according to claim 11, wherein the electrostatic discharge clamp circuit comprises a low-voltage protection seal ring surrounding the first P-type heavily-doped region and the second P-type heavily-doped region, and the low-voltage protection seal ring is formed on the N-type heavily-doped region of the low-voltage N-type well, and the source and gate of the first low-voltage PMOS structure and the low-voltage protection seal ring are electrically connected to the signal transmission terminal pad through the signal transmission line.

14. The ESD protection device structure according to claim 13, wherein among the plurality of low-voltage PMOS structures of the electrostatic discharge clamp circuit, drain of a previous low-voltage PMOS structure is electrically connected to source and gate of a next low-voltage PMOS structure and the low-voltage protection seal ring in sequential order, to form series connection therebetween.

* * * * *